(12) United States Patent
Bales et al.

(10) Patent No.: US 6,573,765 B2
(45) Date of Patent: Jun. 3, 2003

(54) INPUT-OUTPUT BUFFER CIRCUIT AND METHOD FOR AVOIDING INADVERTENT CONDUCTION OF A PULL-UP TRANSISTOR

(75) Inventors: Timothy Bales, Warfield (GB); Ken Hunt, Finchampstead (GB)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/010,760

(22) Filed: Nov. 30, 2001

(65) Prior Publication Data

US 2002/0101272 A1 Aug. 1, 2002

(30) Foreign Application Priority Data

Dec. 15, 2000 (GB) ............................................. 0030667

(51) Int. Cl.$^7$ ................................................ H03K 3/00
(52) U.S. Cl. ....................................... 327/108; 327/112
(58) Field of Search .......................... 327/108–112, 379, 327/382, 434, 436, 437; 326/21, 27, 81–83

(56) References Cited

U.S. PATENT DOCUMENTS

| | | | |
|---|---|---|---|
| 5,004,936 A | | 4/1991 | Andresen ..................... 326/27 |
| 5,646,550 A | * | 7/1997 | Campbell, Jr. et al. ........ 326/81 |
| 5,825,206 A | | 10/1998 | Krishnamurthy et al. ..... 326/81 |
| 5,963,055 A | * | 10/1999 | Tanaka et al. ................ 326/81 |
| 6,246,262 B1 | * | 6/2001 | Morgan et al. ............... 326/81 |

FOREIGN PATENT DOCUMENTS

| | | |
|---|---|---|
| EP | 0 704 974 A1 | 4/1996 |
| EP | 0 821 484 A1 | 1/1998 |
| GB | 2258100 A | 1/1993 |
| GB | 2349999 A | 11/2000 |

OTHER PUBLICATIONS

Dabral S. et al., "Basic ESD and I/O Design", New York, A Wiley Interscience Publication, John Wiley & Sons, Inc., 1998. pp. 260–266.

* cited by examiner

Primary Examiner—Kenneth B. Wells
(74) Attorney, Agent, or Firm—Dorsey & Whitney LLP

(57) ABSTRACT

An input-output (I/O) buffer and a method of biasing an I/O buffer that avoids inadvertent conduction of a pull-up transistor included in the buffer when an input signal having a voltage greater than the supply voltage is applied to the I/O buffer in an input mode. Inadvertent conduction of the pull-up transistor is avoided during an input mode by biasing the gate and the body of the pull-up transistor with a supply voltage until the voltage of the input signal exceeds the voltage of the voltage supply, at which time the voltage of the input signal is applied to the gate and the body of the pull-up transistor instead. The I/O buffer includes a driver circuit having a pull-up transistor and an I/O node to receive an input signal. The I/O buffer also includes a pull-up transistor bias circuit to provide the voltage to the gate and the body of the pull-up transistor.

32 Claims, 5 Drawing Sheets

INPUT-OUTPUT BUFFER CIRCUIT AND METHOD FOR AVOIDING INADVERTENT CONDUCTION OF A PULL-UP TRANSISTOR

TECHNICAL FIELD

The present invention is related generally to integrated circuits, and more particularly, to input-output (I/O) buffer circuits for an integrated circuit.

BACKGROUND OF THE INVENTION

Semiconductor devices often include data pins that serve both input and output (I/O) functions. That is, a data pin, which is internally connected to a pad on the semiconductor device, must be able to provide data signals at an adequate voltage and slew rate to, as well as receive data signals from, a bus to which the data pin is coupled. Moreover, when data is not being provided from or received by the data pin, it should appear as an open circuit in order to avoid pulling down the bus as a current sink. Thus, in order to satisfy these requirements, an I/O buffer circuit included in the semiconductor device should have an input mode where signals applied to the pad are received by the semiconductor device, an output mode where data signals are driven by the buffer circuit having sufficient voltages and transition time, and a tristate mode where the pad is effectively in a high impedance state.

Typical I/O buffer circuits include a PMOS pull-up transistor for the purposes of driving high output data signals. Unlike output buffers using NMOS pull-up transistors, a boot circuit providing a super-voltage to the gate of the pull-up transistor is not required for the full voltage of a supply voltage to be provided for a high output signal. The PMOS pull-up transistor is typically formed in an n-well to facilitate the use of CMOS technology in forming NMOS pull-down transistors for the I/O buffer circuit. However, as a result of the PMOS pull-up transistor being formed in an n-well, when an I/O buffer in input mode receives an input signal having a voltage that sufficiently exceeds the supply voltage, current may be drawn through the PMOS pull-up transistor to the voltage supply as a result of the formation of parasitic diodes and/or inadvertent channel conduction. As the pull-up transistor becomes conductive, the voltage supply coupled to the pull-up transistor behaves as a current sink for the input signal, potentially pulling down the voltage of the input signal and consuming drive current. Where the current consumption is severe, the circuit driving the input signal will not be able to sustain an adequate voltage level for the input signal, resulting in the input signal being read incorrectly.

The situation where the voltage of the input signal exceeds the supply voltage may occur where a relatively low voltage semiconductor device is connected with a bus using higher voltage values. For example, a semiconductor device may have an operating voltage of 3.3 V, but is coupled to a data bus providing data signals having voltages as high as 5.0 V. Moreover, the I/O buffer of the semiconductor device should be designed to accommodate signal fluctuations, in some cases, the voltage of the input signal may reach as high as 5.5 V. In these cases, the voltage of the input signal applied to the pad of the semiconductor device may be great enough to cause the PMOS pull-up transistor of the I/O buffer circuit to conduct.

Moreover, where lower voltage devices are connected to a higher voltage bus, the voltage that may be potentially applied across the transistor may exceed the node-to-node technology voltages limits for the various transistors in the I/O buffer circuit. When node-to-node voltages exceed the technology limits, the transistor may be irreparably damaged. For example, some node-to-node voltage limits for a typical pull-up transistor are: $V_{gs}$, gate-source max.=5 V, $V_{gd}$, gate-drain max.=5 V, $V_{gb}$, gate-bulk max.=5 V, $V_{ds}$, drain-source max.=4 V, $V_{db}$, drain-bulk max.=7 V, $V_{sb}$, source-bulk max.=7 V. As previously discussed, applications of a lower voltage semiconductor device with higher voltage busses may result in node-to-node voltages as high as 5.5 V, thus, exceeding several of the node-to-node voltage limits of the transistor. Where the transistor is irreparably damaged, the I/O buffer circuit may no longer be operational. As a result, I/O buffer circuits have been designed that can accommodate coupling to a bus providing relatively higher voltage data signals, and prevent the transistors of the I/O buffer circuit from being damaged when the voltage of an input signal is sufficient to cause the node-to-node voltage limits of the transistors to be exceeded. One approach to avoiding parasitic diode conduction is to include an additional PMOS transistor coupled between the n-well in which the PMOS pull-up transistor is formed and the voltage supply. The gate of the additional PMOS transistor is coupled to the I/O pad. As the voltage of the input signal applied to the I/O pad exceeds the supply voltage, the n-well is disconnected and left floating to be charged to approximately the voltage of the input signal. Although current is not drawn through the parasitic diodes to the voltage supply, charging the n-well to a relatively high voltage may lead to latch-up problems.

An approach that has been taken to prevent PMOS channel conduction when an input signal having a voltage greater than the supply voltage is to include a gate control block that includes what is essentially a voltage level shifter to drive the gate of the PMOS pull-up transistor during the input mode with a relatively high voltage, such as 5.0 volts. Thus, when an input signal having a voltage greater than the supply voltage is received by the I/O buffer, but less than (5.0V–|Vtpull-up|), where Vtpull-up is the MOS conduction threshold voltage, inadvertent channel conduction is prevented. Although the PMOS pull-up transistor is held in an OFF state, this approach does require a high voltage supply, or additional circuitry to generate the elevated voltage necessary to prevent channel conduction. Where space requirements on a device are limited, the addition of the gate control block may not be an acceptable solution.

Therefore, there is a need for an I/O buffer circuit that, when the input voltage exceeds the supply voltage, prevents inadvertent diode and channel conduction in the PMOS pull-up transistor, and prevents the node-to-node technology voltage limits from being exceeded.

SUMMARY OF THE INVENTION

The invention is directed to an I/O buffer having a pull-up transistor and which avoids inadvertent conduction when an input signal having a voltage greater than the supply voltage is applied to the I/O buffer while in an input mode. The input buffer includes a driver circuit having pull-up and pull-down transistors connected in series, and an I/O node located between the transistors to receive an input signal. A pull-up transistor bias circuit is also included in the I/O buffer. The bias circuit has a low source terminal coupled to a voltage supply, a high source terminal coupled to the I/O node, and a bias terminal coupled to the gate and body of the pull-up transistor to provide a voltage sufficient to avoid inadvertent conduction. While the I/O buffer is set in the input mode, and the voltage of the input signal is less than a voltage threshold, the bias circuit applies the voltage of the voltage supply to the gate and body of the pull-up transistor. However, when the voltage of the input signal exceeds the voltage threshold, the bias circuit applies the voltage of the input signal to the gate and body of the pull-up transistor to prevent inadvertent conduction.

DETAILED DESCRIPTION OF THE INVENTION

Embodiments of the present invention provide an input-output (I/O) buffer that avoids inadvertent conduction of a PMOS pull-up transistor included in the buffer when an input signal having a voltage greater than the supply voltage is applied to the I/O buffer in an input mode. Inadvertent conduction is avoided by biasing the gate and the body of the pull-up transistor with the input signal when the voltage of the input signal exceeds the voltage of the voltage supply. Certain details are set forth below to provide a sufficient understanding of the invention. However, it will be clear to one skilled in the art that the invention may be practiced without these particular details. In other instances, well-known circuits, control signals, timing protocols, and software operations have not been shown in detail in order to avoid unnecessarily obscuring the invention.

Figure 1:
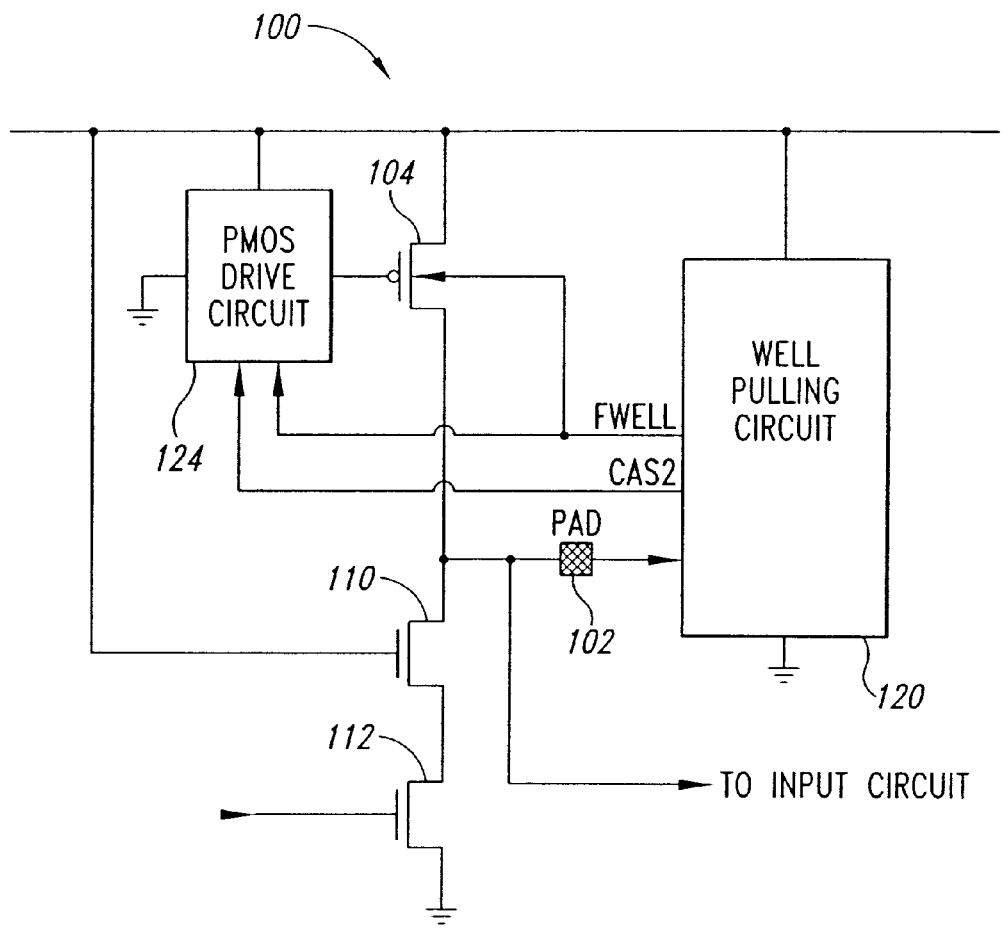
FIG. 1 is a block diagram of a input-output (I/O) buffer circuit according to an embodiment of the present invention.

FIG. 1 illustrates an I/O buffer 100 according to an embodiment of the present invention. An I/O pad 102 is coupled to provide an input signal to an input circuit (not shown) when the I/O buffer 100 is programmed for an input mode. The pad 102 is further coupled to an output node of an output driving circuit that includes a PMOS pull-up transistor 104 and NMOS pull-down transistors 110 and 112. A well pulling circuit 120 is coupled to the pad 102 to receive an input signal, and in response, provide a body potential FWELL to the body of the PMOS transistor 104 and to a PMOS drive circuit 124. As will be explained in more detail below, the FWELL potential provided to the PMOS pull-up transistor 104 and the PMOS drive circuit 124 prevents the PMOS pull-up transistor 104 from conducting and further prevents its node-to-node technology voltage limits from being exceeded when the I/O buffer is in the input mode and a relatively high voltage input signal is applied to the pad 102.

Figure 2:
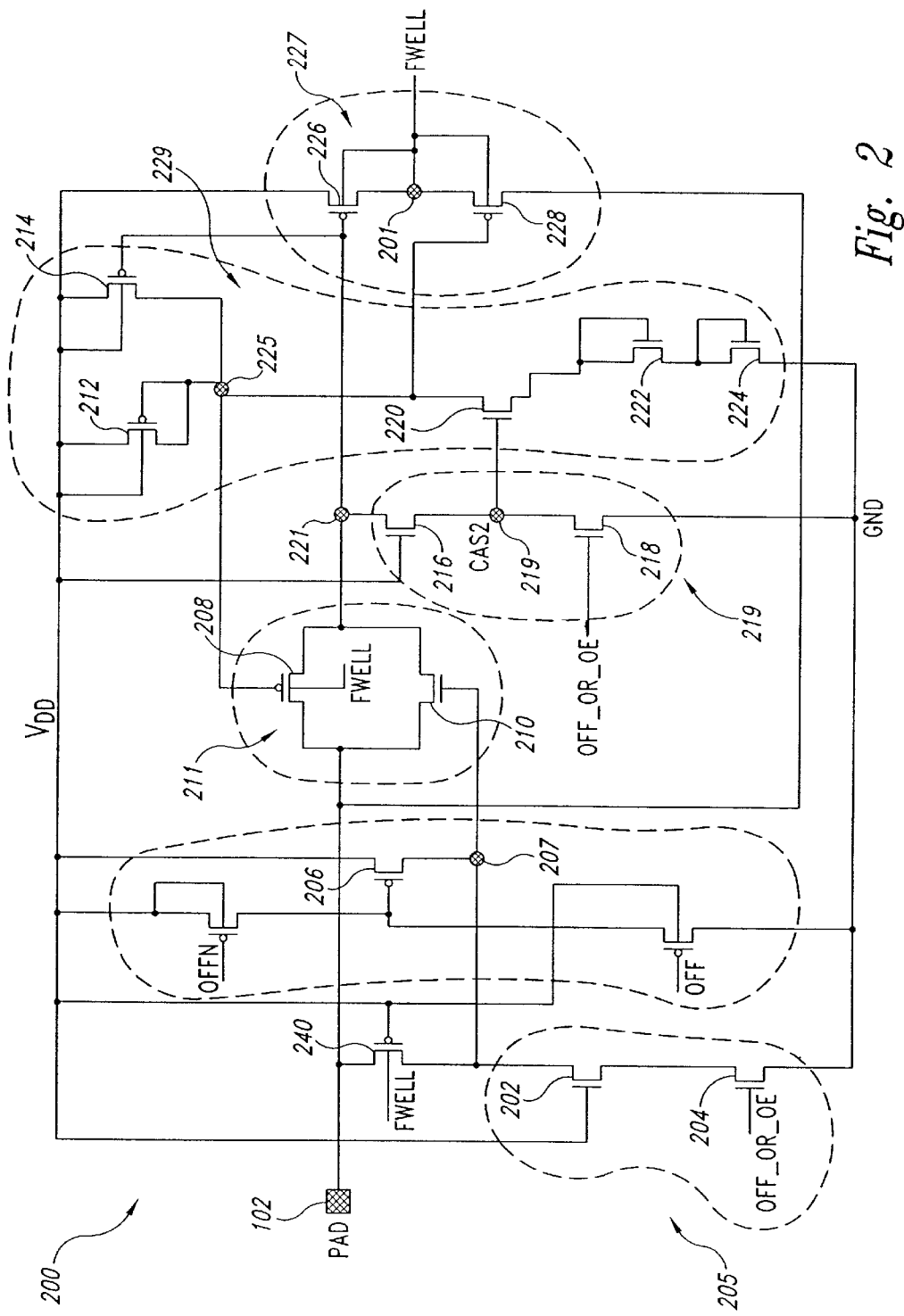
FIG. 2 is a block diagram of a well pulling circuit according to an embodiment of the present invention.

FIG. 2 illustrates an embodiment of a well pulling circuit 200 that may be substituted for the well pulling circuit of FIG. 1. The well pulling circuit 200 provides at an output node 201 an FWELL signal having a voltage equal to Vdd for input signals applied to the pad 102 having a potential less than approximately Vdd, and an FWELL signal having a potential equal to the potential of the input signal for input signals exceeding approximately Vdd. The FWELL signal is applied to the body of the PMOS pull-up transistor 104 (FIG. 1) and, as mentioned previously, is used to prevent inadvertent diode conduction when an input signal greater than Vdd is applied to the pad 102.

In input mode, the operation of the well pulling circuit can be conceptually separated into different ranges of input signal potential, namely: the pad voltage less than (Vdd−Vt); the pad voltage between (Vdd−Vt) and (Vdd+Vt); and the pad voltage greater than (Vdd+Vt), but less than a maximum input voltage value, such as 5.5 V. It will be appreciated, however, that the selection of a maximum input voltage value of 5.5 V is provided merely by way of example, and that the particular maximum input voltage value may be changed without departing from the scope of the present invention. The following discussion will describe the operation of the well pulling circuit 120 with respect to these ranges. In operation, when the I/O buffer 100 (FIG. 1) is set in the input mode, an output enable (OE) signal is deactivated (resulting in OFF=0, which is a power down signal that is inactive low independent of the state of OE or TRI), causing transistors 204 and 218 to switch OFF such that nodes 207, 219 and 221 are no longer held in the discharged low state.

As will be discussed in more detail below, discharge paths 205 and 219 discharge any charge remaining on nodes 207 and 221, respectively, when the I/O buffer 100 is switched to output mode.

In the range where the potential of the input signal applied to pad 102 is less than (Vdd−Vt), the output node 201 of the well pulling circuit 200 is coupled to the Vdd supply through PMOS transistor 226 to provide an FWELL signal having a voltage equal to Vdd. PMOS transistor 226 is included in an FWELL switch circuit 227 which also includes PMOS transistor 228. The PMOS transistor 228 remains OFF in the present input voltage range, but couples the output node 201 of the well pulling circuit 200 to the pad potential when the input voltage begins to approach Vdd. During the input mode, node 357 (FIG. 3) is effectively pulled toward GND and OFF=0. Thus, the PMOS transistor 206 is ON, pulling the node 207 to Vdd. During the output mode, the node 357 is effectively pulled to Vdd, switching the PMOS transistor 206 OFF. As a result, the NMOS pass transistor 210 of pass gate 211 is switched ON, coupling the pad 102 to the gate of the PMOS transistor 226. The PMOS transistor 226 is switched ON to couple the output node 201 to the Vdd supply to provide an FWELL signal having a voltage of Vdd.

As the voltage of the input signal applied to the pad 102 approaches (Vdd−Vt), NMOS transistors 220, 222, and 224 of p-pass bias circuit 229 begin to drain charge from node 225. The NMOS transistor 220 is switched ON by coupling CAS2 node 219 through the NMOS transistor 216 to the node 221. As the charge begins to drain from the node 225, PMOS keeper transistor 212 begins to conduct, and holds the voltage of node 225 to around (Vdd−Vt). In response, PMOS pass transistor 208 of the pass gate 211 begins to switch ON. The NMOS pass transistor 210 also begins to switch OFF as the voltage applied to the pad 102 approaches (Vdd−Vt). In this input voltage range, the node 221 still follows the voltage of the input signal applied to the pad 102, and consequently, the FWELL signal still has a voltage of Vdd. However, the well pulling circuit 200 is setting up to provide an FWELL signal that tracks the input signal as it exceeds Vdd. Note that the p-pass bias circuit 229 is not switched ON permanently because pulling the node 225 low prematurely will result in a rough transition from the PMOS transistor 226 to the PMOS transistor 228. Moreover, current is conserved while the input signal applied to the pad 102 remains in the lower voltage range.

In the transition region where the input voltage applied to the pad 102 is between (Vdd−Vt) and (Vdd+Vt), the NMOS pass transistor 210 switches OFF while the PMOS pass transistor 208 switches ON fully, leaving the node 221 still tracking the voltage of the input signal. As a result, the PMOS transistor 226 begins to switch OFF. The increasing voltage of the input signal further causes the PMOS transistor 228 to begin to switch ON, thus coupling the output node 201 of the well pulling circuit 200 to the pad 102. During the transition between the deactivation/activation of the PMOS transistors 226 and 228, current will flow through the FWELL switch 227. However, it will be appreciated that the dimensions of transistors 226 and 228 should be selected such that large transition currents are minimized, but the output node 201 can still be charged and discharge quickly enough to track a fast transitioning input signal.

For input signals greater than (Vdd+Vt), but less than 5.5 V, the PMOS transistor 226 is fully OFF and the 228 is fully ON, coupling the node 201 to the pad 102. As a result, the FWELL signal provided by the well pulling circuit 200 will now track the input signal voltage applied to the pad 102. In this voltage range, PMOS transistor 240 also switches ON to couple the node 207 to the pad 102. Although coupling the pad 102 to the node 207 will cause a small static current to flow through the PMOS transistor 206, biasing the node 207 with the input signal voltage improves the response on the node 221 for input signals having a fast falling edge. Several of the transistors in the well pulling circuit 200 have the well in which they are formed coupled to the FWELL signal to prevent parasitic PMOS diode conduction. For example, the PMOS transistors 226 and 228 of the FWELL switch 227 have the respective bodies biased by the output node 201. Similarly, the PMOS pass transistor 208 and the PMOS transistor 240 have their bodies coupled to be biased by the FWELL signal.

The previous discussion of the well pulling circuit 200 described operation while the I/O buffer 100 was set in the input mode. When switched to the output mode, the OE signal becomes active. The activation of the OE signal further switches ON the NMOS transistor 204 of discharge path 205 and the NMOS transistor 218 of discharge path 219 to discharge any charge present on the nodes 207 and 221, respectively. The activation of discharge path 205 will eventually cause the node 207 to be grounded and therefore cause the NMOS transistor 210 to switch OFF. Additionally, cascode NMOS transistors 202 and 216 prevent the node-to-node voltage limits for NMOS transistors 204 and 218 from being exceeded when switching from input to output mode. With respect to the node 221, as it is pulled to ground, the PMOS transistor 214 of the p-pass bias circuit 229 is switched ON to switch OFF the PMOS pass transistor 208 and the PMOS transistor 228. The PMOS transistor 226 is switched back ON to couple the output node 201 to the Vdd supply.

As mentioned previously, the node 207 is discharged through the discharge path 205. Where the voltage remaining on the pad 102 is relatively high, immediately coupling the node 207 to ground may result in gate-source/drain voltage across the NMOS pass transistor 210 that exceeds the node-to-node voltage limit of the transistor. However, the PMOS transistor 240 prevents this situation from occurring because the node 207 remains coupled to the pad 102 through the PMOS transistor 240 until the voltage of the pad drops to approximately Vdd, that is, until the voltage across the gate of the NMOS pass transistor 210 is below the node-to-node limit.

Figure 3:
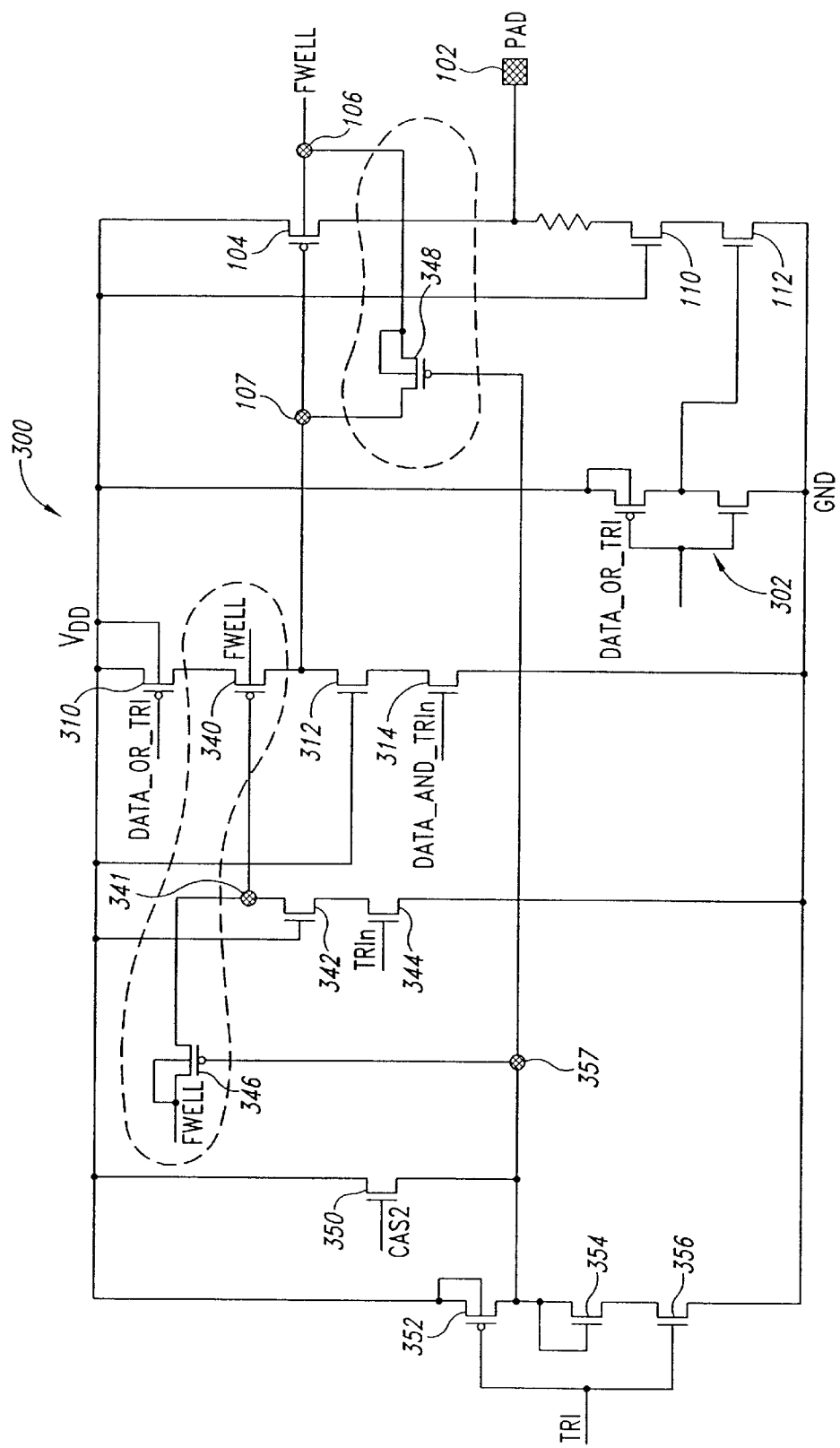
FIG. 3 is a block diagram of a PMOS drive circuit according to an embodiment of the present invention.

FIG. 3 illustrates a PMOS drive circuit 300 that may be substituted for the PMOS drive circuit 124 (FIG. 1). Pull-up transistor 104 and pull-down transistors 110 and 112 are also illustrated in FIG. 3. Many of the transistors illustrated in FIG. 3 represent circuitry that is generally included for driving the pull-up and pull-down transistors. For example, CMOS inverter 302 is coupled to receive a data signal DATA and apply the inverted signal to the pull-down transistor 112 to provide an output data signal on the pad 102. Similarly, PMOS transistor 310 and NMOS transistors 312 and 314 are coupled to receive the DATA signal and apply the inverted signal to the pull-up transistor 104. Several of the remaining transistors are included to provide signals to prevent the PMOS pull-up transistor 104 from inadvertently conducting during the input mode and also prevent the node-to-node voltage of the PMOS pull-up transistor 104 from being exceeded when a relatively high voltage input signal is applied to the pad 102 and the I/O buffer is in the input mode.

In operation, when the I/O buffer 100 (FIG. 1) is set for input mode, an active tristate mode signal TRI is applied to the PMOS drive circuit 300. An inverted TRI signal TRIn is applied to the gate of NMOS discharging transistor 344 to switch it OFF. Although not shown in FIG. 3, the signal applied to the NMOS transistor 314 is the output of an AND logic gate having the DATA signal and an inverted TRI signal as input signals. Consequently, the active TRI signal switches the NMOS transistor 314 OFF. In a similar vein, the signal applied to the CMOS inverter 302 and the PMOS transistor 310 is the output of an OR logic gate having the DATA and TRI signals as input signals. Thus, when the TRI signal is active, the PMOS transistor 310 is OFF and the NMOS transistor of the CMOS inverter 302 is ON, switching OFF NMOS pull-down transistors 110 and 112.

The operation of the PMOS drive circuit 124 (FIG. 1) when the I/O buffer is set for input mode can be described with respect to voltage ranges of the input signal applied to the pad 102. The voltage of the input signal will, as previously discussed, also determine the voltage of the FWELL and CAS2 signals provided to the PMOS drive circuit 300 by the well pulling circuit 120 (FIG. 1). As mentioned above, the well pulling circuit 120 provides an FWELL signal having a voltage equal to Vdd for input signals applied to the pad 102 having a voltage less than Vdd, and an FWELL signal having a voltage equal to the voltage of the input signal when exceeding Vdd.

The active TRI signal further activates the NMOS discharging transistor 356 to couple node 357 to approximately Vt through the diode coupled transistor 354. PMOS balancing transistor 348 is switched ON as a result, coupling together nodes 106 and 107 to balance the voltage applied to the body and the gate of the PMOS pull-up transistor 104. Consequently, the FWELL signal applied to the body of the pull-up transistor 104 is applied to its gate as well. PMOS transistor 346 is also switched ON by the node 357 being pulled to approximately Vt above ground. The FWELL signal applied to the source of the PMOS transistor 346 is coupled to node 341, switching OFF PMOS transistor 340.

As discussed previously with respect to FIG. 2, as the voltage of the input signal applied to the pad 102 rises, the voltage on the CAS2 node 219 also rises. Thus the voltage of the node 357 also increases, although the voltage of the node 357 remains low enough for the PMOS balancing transistor 348 and the PMOS transistor 346 to stay ON.

As the voltage of the input signal applied to the pad 102 exceeds Vdd, PMOS balancing transistor 348 remains ON to continue balancing the voltage between the nodes 106 and 107. As a result, the PMOS pull-up transistor 104 remains OFF, despite the voltage of the input signal exceeding Vdd. The PMOS transistor 346 also remains ON so that the voltage of node 341 also tracks with the voltage of the input signal. The PMOS transistor 340 remains OFF because the increasing voltage of the FWELL signal is provided to both the gate and body of the transistor 340. This also has the effect of preventing the node-to-node voltage limit of the PMOS transistor 340 from being exceeded. The voltage of the node 357 also continues to increase, pulled up by the increasing voltage of the CAS2 node of the well pulling circuit 120 (FIG. 1). Note that the voltage of the CAS2 node will be limited to approximately (Vdd−VtNMOS) such that the transistor 350 does not switch on too heavily when the pad 102 approaches 5.5 V. In this way, the voltage of the node 357 does not get pulled too high and the transistors 346 and 348 remain heavily ON. However, raising the potential of the node 357 ensures that the node-to-node voltage limits for the gate and source of the PMOS balancing transistor 348 and the PMOS transistor 346 are not exceeded as the FWELL signal begins to track the voltage of the input signal.

When the mode of the I/O buffer 100 switches from input to output mode, the TRI signal becomes inactive, switching ON the PMOS transistor 352 and NMOS discharging transistor 344. The charge of the node 341 is discharged through NMOS transistor 342 and the NMOS discharging transistor 344, which switches ON the PMOS transistor 340. The node 357 is coupled through the PMOS transistor 352 to the Vdd supply, switching OFF the PMOS balancing transistor 348 and the PMOS transistor 346. The PMOS pull-up transistor 104 can now be driven normally as part of an output buffer. That is, the data signal applied to the gates of the PMOS drive transistor 310 and the NMOS drive transistor 314 will determine the conductive state of the PMOS pull-up transistor 104. Similarly, the data signal applied to the gates of the CMOS inverter 302 determines the conductive state of the NMOS pull-down transistors 110 and 112. The node-to-node voltage limits for the NMOS discharging transistor 344 and the NMOS drive transistor 314 are kept from being exceeded when switching from the input to output mode by cascode NMOS transistors 312 and 342.

Figure 4:
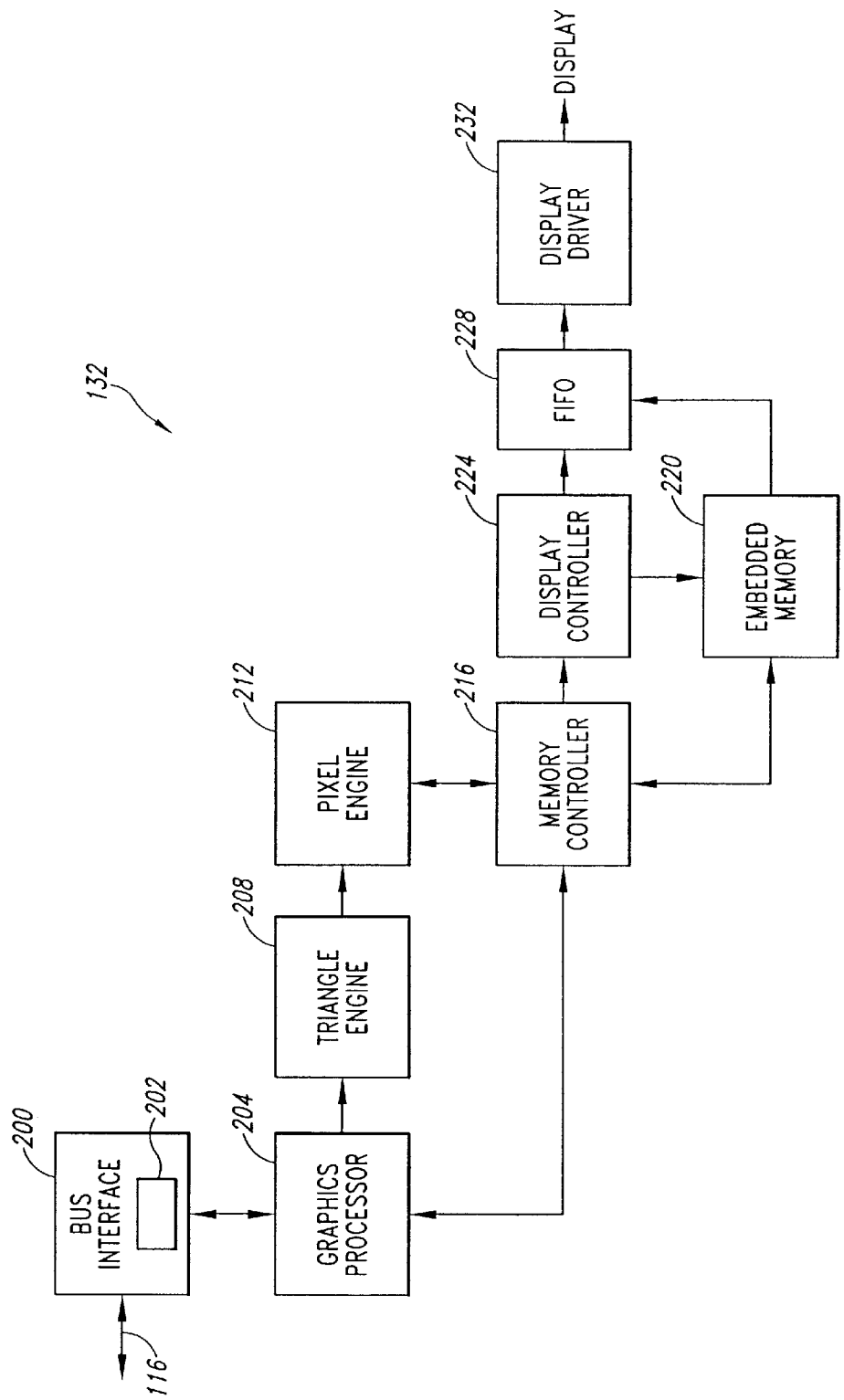
FIG. 4 is a block diagram of a graphics processing system in which embodiments of the present invention may be implemented.

FIG. 4 illustrates circuitry included within a graphics processing system 132 that performs various three-dimensional (3D) graphics functions. Embodiments of the present invention may be implemented in such a system. A bus interface 200 couples the graphics processing system 132 to an expansion bus (not shown) 116 that is typically part of a larger computer system. As used herein, the expansion bus 116 includes computer busses such as an industry standard architecture (ISA) bus, a peripheral component interconnect (PCI) bus, or a high speed bus, such as an accelerated graphics port (AGP). An AGP bus provides the graphics processing system 132 with direct memory access (DMA) to a host memory. That is, the high speed bus and memory bus interface 200 allow the graphics processing system 132 to read and write a host memory without the intervention of a system processor. Thus, data may be transferred to, and from, the host memory at transfer rates much greater than over a ISA or PCI expansion bus. The bus interface 200 includes a DMA controller (not shown) to coordinate transfer of data to and from a host memory 108 and system processor. Also included in the bus interface 200 is an I/O buffer 202 which may be substituted with embodiments of the present invention. The I/O buffer 202 accommodates higher voltage signals that are provided over the expansion bus 116 without the inadvertent conduction problems of conventional I/O buffer circuits.

A graphics processor 204 is coupled to the bus interface 200 and is designed to perform various graphics and video processing functions, such as, but not limited to, generating vertex data and performing vertex transformations for polygon graphics primitives that are used to model 3D objects. The graphics processor 204 is coupled to a triangle engine 208 that includes circuitry for performing various graphics functions, such as clipping, attribute transformations, rendering of graphics primitives, and generating texture coordinates for a texture map. A pixel engine 212 is coupled to receive the graphics data generated by the triangle engine 208. The pixel engine 212 contains circuitry for performing various graphics functions, such as, but not limited to, texture application or mapping, bilinear filtering, fog, blending, and color space conversion.

A memory controller 216 coupled to the pixel engine 212 and the graphics processor 204 handles memory requests to and from an embedded memory 220. The embedded memory 220 stores graphics data, such as source pixel color values and destination pixel color values. The memory controller 216 includes various registers that, as will be explained in more detail below, store values that are used to disable faulty blocks of memory during the access of the embedded memory 220. In this way, a graphics processing system that is otherwise functional, but has a faulty block of embedded memory that cannot be entirely replaced by available redundant memory, can nevertheless still be used for graphics processing.

A display controller 224 coupled to the embedded memory 220 and to a first-in first-out (FIFO) buffer 228 controls the transfer of destination color values to the FIFO 228. Destination color values stored in the FIFO 336 are provided to a display driver 232 that includes circuitry to provide digital color signals, or convert digital color signals to red, green, and blue analog color signals, to drive the display 140 (FIG. 1).

Figure 5:
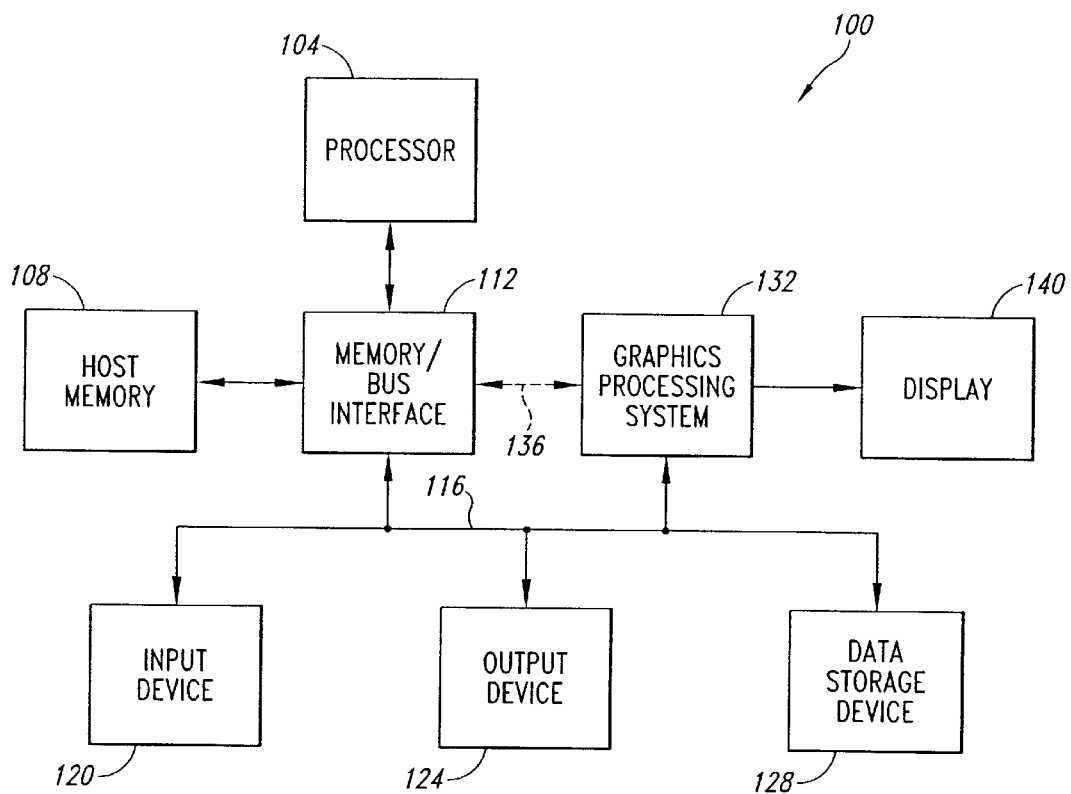
FIG. 5 is a block diagram of a computer system in which the graphics processing system of FIG. 4 is included.

FIG. 5 illustrates a computer system 100 in which the graphics processing system 132 is included. The computer system 100 includes a processor 104 coupled to a host memory 108 through a memory/bus interface 112. The memory/bus interface 112 is coupled to an expansion bus 116. The computer system 100 also includes one or more input devices 120, such as a keypad or a mouse, coupled to the processor 104 through the expansion bus 116 and the memory/bus interface 112. The input devices 120 allow an operator or an electronic device to input data to the computer system 100. One or more output devices 120 are coupled to the processor 104 to provide output data generated by the processor 104. The output devices 124 are coupled to the processor 104 through the expansion bus 116 and memory/bus interface 112. Examples of output devices 124 include printers and a sound card driving audio speakers. One or more data storage devices 128 are coupled to the processor 104 through the memory/bus interface 112 and the expansion bus 116 to store data in, or retrieve data from, storage media (not shown). Examples of storage devices 128 and storage media include fixed disk drives, floppy disk drives, tape cassettes and compact-disc read-only memory drives.

The computer system 100 further includes a graphics processing system 132 coupled to the processor 104 through the expansion bus 116 and memory/bus interface 112. Alternatively, the graphics processing system 132 may be coupled directly to the memory/bus interface 112 through an alternative bus architecture 136, such as an AGP. A display 140 is coupled to the graphics processing system 132 to display graphics images. The display 140 may be any type of display, such as a cathode ray tube (CRT), a field emission display (FED), a liquid crystal display (LCD), or the like, which are commonly used for desktop computers, portable computers, and workstation or server applications.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An input/output (I/O) buffer having an input mode and coupled between first and second supply voltages, the I/O buffer comprising:
   an I/O node to receive an input signal;
   a PMOS pull-up transistor having gate, source, drain and body terminals, the source terminal coupled to the first supply voltage and the drain terminal coupled to the I/O node;
   a pull-down transistor having source and drain terminals, the source terminal coupled to the second supply voltage and the drain terminal coupled to I/O node; and
   a pull-up transistor bias circuit having a bias terminal coupled to the body and gate terminals of the pull-up transistor,
   a well pulling circuit having a first drive transistor coupled between the first supply voltage and the bias terminal to couple the bias terminal to the first supply voltage during the input mode in response to the input signal having a voltage less than a voltage threshold, the well pulling circuit further having a second drive transistor coupled between the bias terminal and the I/O node to couple the bias terminal to the I/O node during the input mode in response to the input signal having a voltage greater than the voltage threshold, and
   a PMOS drive circuit having a drive terminal coupled to the gate of the PMOS pull-up transistor and further coupled to the bias terminal through a balance switch to couple the body and gate terminals of the pull-up transistor during the input mode.

2. The I/O buffer of claim 1 wherein the pull-down transistor comprises an NMOS transistor.

3. The I/O buffer of claim 1 wherein the voltage threshold is approximately equal to the voltage of the first supply voltage.

4. The I/O buffer of claim 1 wherein the PMOS pull-up transistor is formed in an n-well.

5. An input/output (I/O)buffer coupled between first and second supply voltages for receiving an input signal during an input mode and for providing an output signal during an output mode, the I/O buffer comprising:
   a driver circuit having pull-up and pull-down transistors coupled in series and an I/O node disposed therebetween to receive the input signal, the pull up transistor having gate and body terminals; and
   a pull-up transistor bias circuit having a bias terminal coupled to the gate and body terminals of the pull-up transistor,
   a well pulling circuit having a first drive transistor coupled between the first supply voltage and the bias terminal to couple the bias terminal to the first supply voltage during the input mode in response to the input signal having a voltage less than a voltage threshold, the well pulling circuit further having a second drive transistor coupled between the bias terminal and the I/O node to couple the bias terminal to the I/O node in response to the input signal having a voltage greater than the voltage threshold, and
   a pull-up transistor drive circuit having a drive terminal coupled to the gate of the pull-up transistor and further coupled to the bias terminal through a balance switch to couple the body and gate terminals of the pull-up transistor during the input mode.

6. The I/O buffer of claim 5 wherein the pull-up transistor comprises a PMOS transistor.

7. The I/O buffer of claim 6 wherein the PMOS pull-up transistor is formed in an n-well.

8. The I/O buffer of claim 5 wherein the pull-down transistor comprises an NMOS transistor.

9. The I/O buffer of claim 5 wherein the voltage threshold is approximately equal to the voltage of the first supply voltage.

10. The I/O buffer of claim 5 wherein the well pulling circuit comprises:
    a pass gate having an input terminal coupled to the I/O node, and further having an output terminal and p- and n-gate terminals, the pass gate coupling a signal applied to the input terminal to the output terminal in response to receiving activation signals on the p- and n-gate terminals;
    a p-pass gate bias circuit having a p-gate activation terminal coupled to the p-gate terminal of the pass gate and an activation terminal coupled to the output terminal of the pass gate, and further having a second source activation terminal, the p-pass gate bias circuit providing an activation signal on the second source activation terminal responsive to signal provided on the output terminal of the pass gate;
    a well switch having a bias output coupled to the bias terminal, a first activation terminal coupled to the output terminal of the pass gate, a second activation terminal coupled to the second source activation terminal of the p-pass gate bias circuit, a first source terminal coupled to the first supply voltage and a second source terminal coupled to the I/O node, the well switch coupling the I/O node to the bias output responsive to an activation signal received on the second activation terminal and coupling the first voltage source to the bias output responsive to the output of the pass gate; and
    a first discharge path coupled to the first activation terminal and a second discharge path coupled to the n-gate terminal to discharge the respective nodes in response to the I/O buffer entering the output mode.

11. The I/O buffer of claim 10 wherein the well switch comprises:
    a first PMOS transistor having a gate coupled to the output terminal of the pass gate, a source coupled to the first supply voltage, and body and drain coupled to the bias terminal; and
    a second PMOS transistor having a gate coupled to the second source activation terminal, a source coupled to the I/O node, and body and drain coupled to the bias terminal.

12. A graphics processing system, comprising:
    a bus interface for coupling to a system bus, the bus interface having an input/output (I/O) buffer coupled between first and second supply voltages for receiving an input signal during an input mode and for providing an output signal during an output mode, the I/O buffer comprising:
    a driver circuit having pull-up and pull-down transistors coupled in series and an I/O node disposed therebetween to receive the input signal, the pull up transistor having gate and body terminals; and
    a pull-up transistor bias circuit having a bias terminal coupled to the gate and body terminals of the pull-up transistor, a well pulling circuit having a first drive transistor coupled between the first supply voltage and the bias terminal to couple the bias terminal to the first supply voltage during the input mode in response to the input signal having a voltage less than a voltage threshold, the well pulling circuit further having a second drive transistor coupled between the bias terminal and the I/O node to couple the bias terminal to the I/O node during the input mode in response to the input signal having a voltage greater than the voltage threshold, and a pull-up transistor drive circuit having a drive terminal coupled to the gate of the pull-up transistor and further coupled to the bias terminal through a balance switch to selectively couple the body and gate terminals of the pull-up transistor during the input mode;

a graphics processor coupled to the bus interface to process graphics data;

address and data busses coupled to the graphics processor to transfer address and graphics data to an from the graphics processor; and display logic coupled to the data bus to drive a display.

13. The graphics processing system of claim 12 wherein the pull-up transistor comprises a PMOS transistor.

14. The graphics processing system of claim 13 wherein the PMOS pull-up transistor is formed in an n-well.

15. The graphics processing system of claim 12 wherein the pull-down transistor comprises an NMOS transistor.

16. The graphics processing system of claim 12 wherein the voltage threshold is approximately equal to the voltage of the first supply voltage.

17. The graphics processing system of claim 12 wherein the well pulling circuit comprises:

a pass gate having an input terminal coupled to the I/O node, and further having an output terminal and p- and n-gate terminals, the pass gate coupling a signal applied to the input terminal to the output terminal in response to receiving activation signals on the p- and n-gate terminals;

a p-pass gate bias circuit having a p-gate activation terminal coupled to the p-gate terminal of the pass gate and an activation terminal coupled to the output terminal of the pass gate, and further having a second source activation terminal, the p-pass gate bias circuit providing an activation signal on the second source activation terminal responsive to signal provided on the output terminal of the pass gate;

a well switch having a bias output coupled to the bias terminal, a first activation terminal coupled to the output terminal of the pass gate, a second activation terminal coupled to the second source activation terminal of the p-pass gate bias circuit, a first source terminal coupled to the first supply voltage and a second source terminal coupled to the I/O node, the well switch coupling the I/O node to the bias output responsive to an activation signal received on the second activation terminal and coupling the first voltage source to the bias output responsive to the output of the pass gate; and a first discharge path coupled to the first activation terminal and a second discharge path coupled to the n-gate terminal to discharge the respective nodes in response to the I/O buffer entering the output mode.

18. The graphics processing system of claim 17 wherein the well switch comprises:

a first PMOS transistor having a gate coupled to the output terminal of the pass gate, a source coupled to the first supply voltage, and body and drain coupled to the bias terminal; and a second PMOS transistor having a gate coupled to the second source activation terminal, a source coupled to the I/O node, and body and drain coupled to the bias terminal.

19. A computer system, comprising:

a system processor;

a system bus coupled to the system processor;

a system memory coupled to the system bus; and a graphics processing system coupled to the system bus, the graphics processing system comprising:

a bus interface for coupling to a system bus, the bus interface having an input/output (I/O) buffer coupled between first and second supply voltages for receiving an input signal during an input mode and for providing an output signal during an output mode, the I/O buffer comprising:

a driver circuit having pull-up and pull-down transistors coupled in series and an I/O node disposed therebetween to receive the input signal, the pull up transistor having gate and body terminals; and a pull-up transistor bias circuit having a bias terminal coupled to the gate and body terminals of the pull-up transistor, a well pulling circuit having a first drive transistor coupled between the first supply voltage and the bias terminal to couple the bias terminal to the first supply voltage during the input mode in response to the input signal having a voltage less than a voltage threshold, the well pulling circuit further having a second drive transistor coupled between the bias terminal and the I/O node to couple the bias terminal to the I/O node during the input mode in response to the input signal having a voltage greater than the voltage threshold, and a pull-up transistor drive circuit having a drive terminal coupled to the gate of the pull-up transistor and further coupled to the bias terminal through a balance switch to selectively couple the body and gate terminals of the pull-up transistor during the input mode;

a graphics processor coupled to the bus interface to process graphics data;

address and data busses coupled to the graphics processor to transfer address and graphics data to an from the graphics processor; and display logic coupled to the data bus to drive a display.

20. The computer system of claim 19 wherein the pull-up transistor comprises a PMOS transistor.

21. The computer system of claim 20 wherein the PMOS pull-up transistor is formed in an n-well.

22. The computer system of claim 19 wherein the pull-down transistor comprises an NMOS transistor.

23. The computer system of claim 19 wherein the voltage threshold is approximately equal to the voltage of the first supply voltage.

24. The computer system of claim 19 wherein the well pulling circuit comprises:

a pass gate having an input terminal coupled to the I/O node, and further having an output terminal and p- and n-gate terminals, the pass gate coupling a signal applied to the input terminal to the output terminal in response to receiving activation signals on the p- and n-gate terminals;

a p-pass gate bias circuit having a p-gate activation terminal coupled to the p-gate terminal of the pass gate and an activation terminal coupled to the output terminal of the pass gate, and further having a second source activation terminal, the p-pass gate bias circuit providing an activation signal on the second source activation terminal responsive to signal provided on the output terminal of the pass gate;

a well switch having a bias output coupled to the bias terminal, a first activation terminal coupled to the output terminal of the pass gate, a second activation terminal coupled to the second source activation terminal of the p-pass gate bias circuit, a first source terminal coupled to the first supply voltage and a second source terminal coupled to the I/O node, the well switch coupling the I/O node to the bias output responsive to an activation signal received on the second activation terminal and coupling the first voltage source to the bias output responsive to the output of the pass gate; and a first discharge path coupled to the first activation terminal and a second discharge path coupled to the n-gate terminal to discharge the respective nodes in response to the I/O buffer entering the output mode.

25. The computer system of claim 24 wherein the well switch comprises:

a first PMOS transistor having a gate coupled to the output terminal of the pass gate, a source coupled to the first supply voltage, and body and drain coupled to the bias terminal; and a second PMOS transistor having a gate coupled to the second source activation terminal, a source coupled to the I/O node, and body and drain coupled to the bias terminal.

26. A method for biasing an input/output (I/O) buffer having a PMOS pull-up transistor coupled between a supply voltage and an I/O node that receives an input signal, the method comprising:

activating a balancing switch coupled to a gate and a body of the pull-up transistor during an input mode;

in the input mode, applying a first voltage to the gate and the body of the pull-up transistor when the input signal has a voltage less than the first voltage; and in the input mode, applying the input signal to the gate and the body of the pull-up transistor when the input signal has a voltage greater than the first voltage.

27. The method of claim 26, further comprising deactivating the balancing switch when the I/O buffer enters an output mode.

28. The method of claim 26 wherein applying the first voltage comprises coupling the gate and the body of the pull-up transistor to the supply voltage, and applying the input signal comprises coupling the gate and the body of the pull-up transistor to the I/O node.

29. A method for biasing an input/output (I/O) buffer during an input mode, the I/O buffer having a PMOS pull-up transistor coupled between a supply voltage and an I/O node that receives an input signal, the method comprising:

activating a balancing switch coupled between a gate terminal and a body terminal of the pull-up transistor;

coupling the gate terminal and the body terminal of the pull-up transistor to the supply voltage when the input signal has a voltage less than a first voltage; and coupling the gate and the body terminals of the pull-up transistor to the I/O node when the input signal has a voltage greater than the first voltage.

30. The method of claim 29, further comprising deactivating the balancing switch when the I/O buffer enters an output mode.

31. The method of claim 29 wherein coupling to the supply voltage comprises activating a first source transistor having a body terminal coupled to the body of the pull-up transistor and coupling to the I/O node comprises activating a second source transistor having a body terminal coupled to the body of the pull-up transistor.

32. The method of claim 29 wherein the first voltage is the voltage of the supply voltage.

* * * * *